United States Patent
Zhuang et al.

(10) Patent No.: US 6,897,501 B2
(45) Date of Patent: May 24, 2005

(54) AVOIDING SHORTING IN CAPACITORS

(75) Inventors: Haoren Zhuang, Tokyo (JP); Ulrich Egger, Kanagawa (JP); Jingyu Lian, Tokyo (JP); Gerhard Beitel, Kanagawa (JP); Karl Hornik, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/248,897

(22) Filed: Feb. 28, 2003

(65) Prior Publication Data

US 2004/0169211 A1 Sep. 2, 2004

(51) Int. Cl.[7] .................. H01L 29/76; H01L 29/94; H01L 31/062; H01L 31/113; H01L 31/119
(52) U.S. Cl. .................. 257/295; 257/303; 257/306
(58) Field of Search .................. 257/295, 303, 257/306

(56) References Cited

U.S. PATENT DOCUMENTS

| | | | |
|---|---|---|---|
| 5,840,200 A | 11/1998 | Nakagawa et al. | 216/6 |
| 5,903,492 A | 5/1999 | Takashima | 365/145 |
| 5,965,942 A * | 10/1999 | Itoh et al. | 257/761 |
| 6,184,550 B1 * | 2/2001 | Van Buskirk et al. | 257/306 |
| 6,229,171 B1 * | 5/2001 | Chun et al. | 257/296 |
| 6,284,619 B1 | 9/2001 | Seymour et al. | 438/396 |
| 6,344,964 B1 * | 2/2002 | Adler | 361/306.3 |
| 6,440,815 B1 | 8/2002 | Mitsuhashi | 438/396 |
| 6,452,779 B1 * | 9/2002 | Adler et al. | 361/306.3 |
| 6,459,115 B1 * | 10/2002 | Kim | 257/304 |
| 6,521,927 B2 * | 2/2003 | Hidaka et al. | 257/295 |
| 6,611,014 B1 * | 8/2003 | Kanaya et al. | 257/295 |
| 2001/0023097 A1 * | 9/2001 | Huang | 438/238 |
| 2002/0071237 A1 | 6/2002 | Adler | 361/302 |
| 2002/0125524 A1 * | 9/2002 | Okudaira et al. | 257/310 |
| 2003/0008467 A1 | 1/2003 | Kai et al. | 438/393 |
| 2003/0036243 A1 | 2/2003 | Hironaka et al. | 438/396 |
| 2003/0132470 A1 * | 7/2003 | Joshi et al. | 257/295 |

FOREIGN PATENT DOCUMENTS

JP      2000091540      3/2000

* cited by examiner

*Primary Examiner*—Amir Zarabian
*Assistant Examiner*—Ida M. Soward
(74) *Attorney, Agent, or Firm*—Horizon IP Pte Ltd (57) ABSTRACT

A capacitor structure having a capacitor with a top electrode, a bottom electrode, and a capacitor dielectric layer between the top and bottom electrodes is disclosed. The capacitor includes upper and lower portions. The demarcation between the upper and lower portion is located between top and bottom surfaces of the capacitor dielectric layer. A dielectric layer is provided on the sidewalls of the upper portion of the capacitor to prevent shorting between the electrodes that can be caused by a conductive fence formed during processing.

22 Claims, 8 Drawing Sheets

FIG 1

Prior Art

FIG 2

Prior Art

AVOIDING SHORTING IN CAPACITORS

BACKGROUND OF INVENTION

Figure 1:
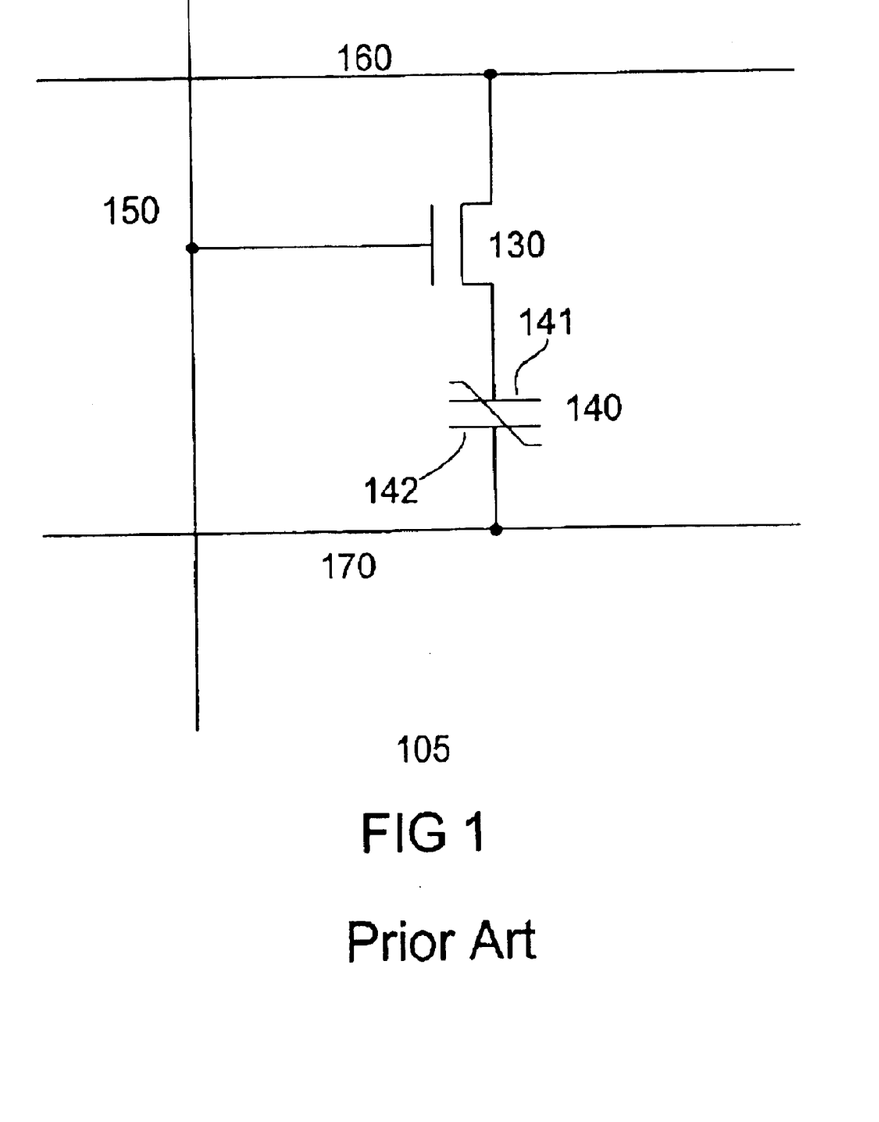
FIG. 1 shows a conventional capacitor.

Ferroelectric metal oxide ceramic materials such as lead zirconate titanate (PZT) have been investigated for use in ferroelectric semiconductor memory devices. Other ferroelectric materials, for example, strontium bismuth tantalate (SBT) can also be used. FIG. 1 shows a conventional ferroelectric memory cell 105 having a transistor 130 and a ferroelectric capacitor 140. An electrode 142 is coupled to a plateline 170 and another electrode 141 is coupled to the transistor which selectively couples or decouples the capacitor from a bitline 160, depending on the state (active or inactive) of a wordline 150 coupled to the transistor gate.

The ferroelectric memory stores information in the capacitor as remnant polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

Figure 2:
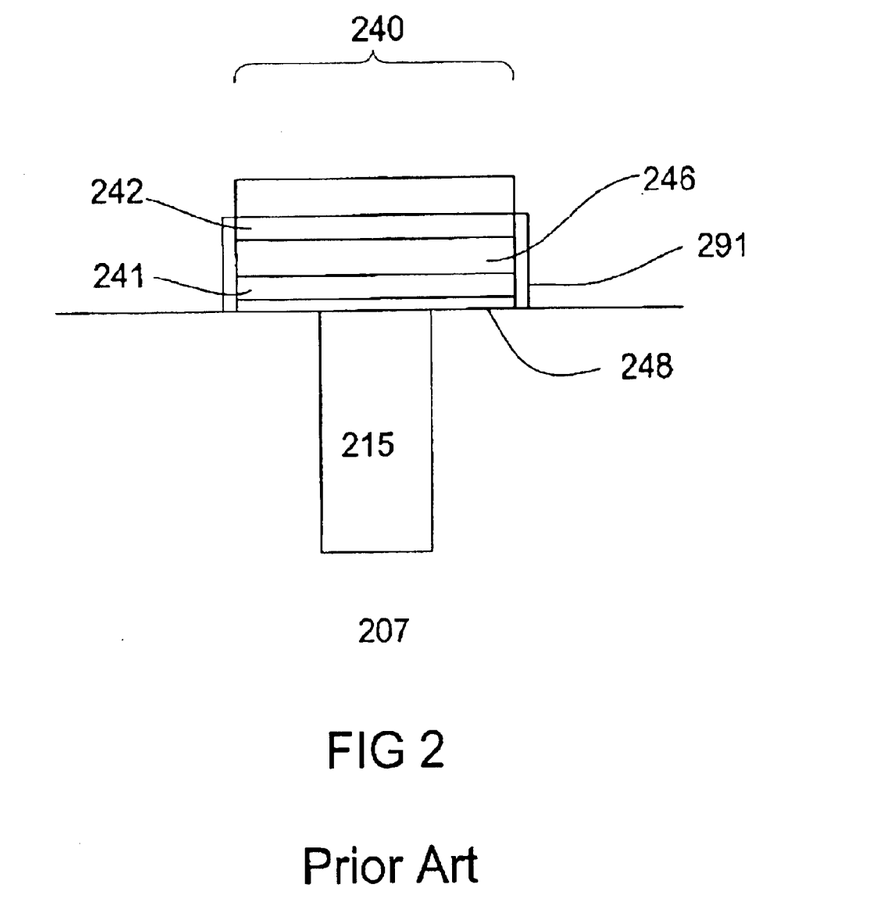
FIG. 2 shows a capacitor in accordance with one embodiment of the invention.

FIG. 2 shows a cross-section of a ferroelectric capacitor-over-plug (COP) structure 207. The structure comprises a capacitor 240 having a ferroelectric layer 246 disposed between bottom and top electrodes 241 and 242. A plug 215 is coupled to the bottom electrode. The plug is coupled to, for example, a diffusion region of a transistor, forming a memory cell. Typically, a barrier layer 248 is provided between the plug and the electrode of the capacitor to inhibit diffusion of oxygen which can oxidize the plug.

During the reactive ion etch (RIE) process which forms the capacitor, a thin conductive layer 291 (e.g., conductive fence) forms around the capacitor. This conductive layer shorts the top and bottom electrodes of the capacitor, rendering the capacitor defective. The conductive fence forms because of the sputtering nature of the metal RIE process. Once the fence forms, it is very difficult to remove during further etching process because of the vertical profile.

From the foregoing discussion, it is desirable to provide a capacitor which avoids the shorting problem caused by a conductive fence formed during processing.

SUMMARY OF INVENTION

The invention relates generally to ICs. More particularly, the invention relates to ICs having an improved capacitor structure. In one embodiment, the capacitor structure includes a capacitor having a top electrode, a bottom electrode, and a capacitor dielectric layer between the top and bottom electrodes. In one embodiment, the capacitor is a ferroelectric capacitor. The capacitor comprises an upper and lower portion. The demarcation between the upper and lower portion is located between top and bottom surfaces of the capacitor dielectric layer. In one embodiment, a dielectric layer is provided on the sidewalls of the upper portion of the capacitor. The dielectric layer prevents shorting of the electrodes which may be caused by a conductive fence that may form during processing.

DETAILED DESCRIPTION

The invention relates to capacitors which avoid shorting between the top and bottom electrodes. The capacitors, for example, are used to form memory cells. The capacitors can also be used for other purposes. The memory cells are interconnected to form a memory array of an IC, such as a memory IC. Forming other types of ICs, such as embedded ICs or system-on-chip, is also useful.

Figure 3:
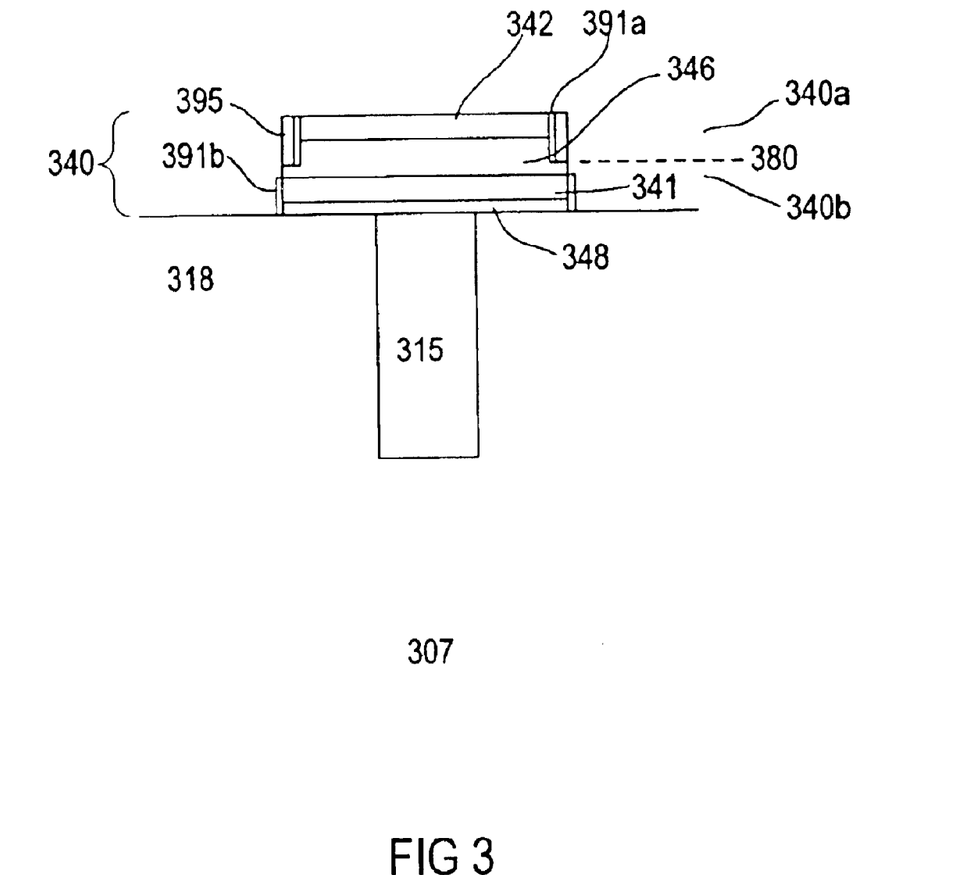
FIG. 3 shows one embodiment of the invention.

FIG. 3 shows a cross-section of a capacitor structure 307 in accordance with one embodiment of the invention. In one embodiment, the capacitor structure is a COP structure comprising a capacitor 340 coupled to a first plug 315. Other types of capacitor structures are also useful. The capacitor, in one embodiment, comprises top and bottom electrodes 342 and 341 separated by a dielectric layer 346.

In one embodiment, the capacitor comprises a ferroelectric capacitor. The dielectric layer of the ferroelectric capacitor comprises a ferroelectric material, such as PZT. Other types of ferroelectric materials, including SBT, are also useful. The electrode can be formed from a noble metal such as platinum. Other types of conductive materials or conductive oxides, for example SRO or IRO, are also useful. The top and bottom electrodes need not be formed from the same material. Providing other types of capacitors is also useful. For example, the capacitor can be a non-ferroelectric capacitor, such as a high k dielectric capacitor.

In accordance with one embodiment of the invention, the capacitor comprises upper and lower portions 340a–b. The demarcation line 380 between the upper and lower portion is located in the dielectric layer between the top and bottom electrodes. An insulating spacer layer 395 is provided on the sidewalls of the upper portion of the capacitor. The insulating spacer layer comprises, for example, silicon oxide, aluminum oxide, or silicon nitride. Other types of insulating materials, such as nitrides, oxides, or a combination thereof, are also useful. The sidewall spacer interrupts the continuity of the conductive fence 391 which may form during etching of the capacitor layers. As shown, the sidewall spacer covers an upper portion 391a of the fence, separating it from a bottom portion 391b. The thickness of the spacer layer should be sufficient to disrupt the electrical connection between the upper and lower portions of the fence. Typically, the thickness of the spacer layer is about 1–10 nm. Providing spacers with other thicknesses is also useful.

The demarcation between the upper and lower portions of the capacitor can be located anywhere between the top and bottom surfaces of the dielectric layer. In one embodiment, the location of the demarcation prevents shorting of the electrodes. Preferably, the location of the demarcation is at least 3 nm away from the bottom surface of the capacitor dielectric layer (e.g. bottom electrode). More preferably, the location of the demarcation is at least 5–10 nm away from the bottom surface of the capacitor dielectric layer. Illustratively, the surface area or dimension of the upper portion (including the spacer) is about the same as the lower portion (excluding the lower portion of the fence).

The first plug couples the capacitor to, for example, a diffusion region of a transistor to form a memory cell. The plug (active area capacitor or AAC) comprises a conductive material, such as tungsten or poly-Si. Other types of conductive materials can also be used. If poly-Si is used to form the plug, a metal silicide layer can be provided between the plug and electrode. The metal silicide comprises, for example, titanium or cobalt. Other types of silicides are also useful.

For applications where oxidation of the plug is a concern, for example, a barrier layer 348 is provided between the plug and bottom electrode of the capacitor. The barrier layer inhibits the diffusion of oxygen to the plug, reducing or preventing oxidation of the plug. In one embodiment, the barrier layer comprises iridium oxide. Other types of barrier materials which inhibit the diffusion of oxygen can also be used. An adhesion layer can be provided beneath the barrier layer to promote adhesion between the barrier layer and a dielectric layer 318, such as silicon oxide. Other dielectric materials, such as silicon nitride, can also be used.

A second plug (second active area or SAA) is coupled to the second diffuison region. The SAA plug couples, for example, the transistor to a bitline of the array. In one embodiment, the second electrode comprises tungsten. Other conductive materials can also be used. The top capacitor electrode is coupled to, for example, a plateline. Alternatively, the top capacitor electrode can be coupled to a reference voltage source, such as $V_{DD}/2$, where $V_{DD}$ is the operating voltage. Providing other voltage levels for the reference voltage, such as ground, is also useful. Coupling the top electrode to a reference voltage is particularly useful for non-ferroelectric memory cells. The gate of the transistor serves as or is coupled to a wordline. A plurality of memory cells are interconnected by wordlines and bitlines (and platelines, if applicable) to form a memory array. The memory cells can be arranged in, for example, a folded bitline architecture. Other types of architectures, such as open, are also useful.

In another embodiment, the capacitor structure comprises first and second capacitors which share a bottom electrode. Such capacitor structures are, for example, used in series memory architectures, such as those described in, for example, U.S. Pat. No. 5,903,492 "Semiconductor Memory Device and Various Systems Mounting Them", which is herein incorporated by reference for all purposes. The top capacitor electrode is coupled to the other or second diffusion region of its respective cell transistor. A first end of the group is coupled to a bitline and a second end is coupled to a reference voltage. Alternatively, the second end is coupled to a plateline. This is particularly useful for ferroelectric memory cells. The gate of a transistor serves as or is a wordline. A plurality of groups are interconnected to form an array.

FIGS. 4–8 show a process for forming a capacitor structure 407 in accordance with one embodiment of the invention. Although only one capacitor is described, it is understood that a plurality of capacitors, along with other circuitry, can be formed to create an IC. As shown, a substrate 402 is provided. The substrate, for example, is a semiconductor substrate formed from silicon. Other types of semiconductor substrates can also be used. The substrate can be prepared with a transistor (not shown) having a gate and first and second diffusion regions. The gate, for example, is a gate conductor that interconnects to other memory cells. A dielectric layer 418, such as silicon dioxide ($SiO_2$), is deposited over the transistor. Other types of dielectric material, such as silicon nitride, spin-on glass (SOG), and doped or undoped silicate glass, are also useful. In one embodiment, the dielectric layer is deposited using conventional techniques. Such techniques include, for example, chemical vapor deposition (CVD) or spin-on.

Figure 4:
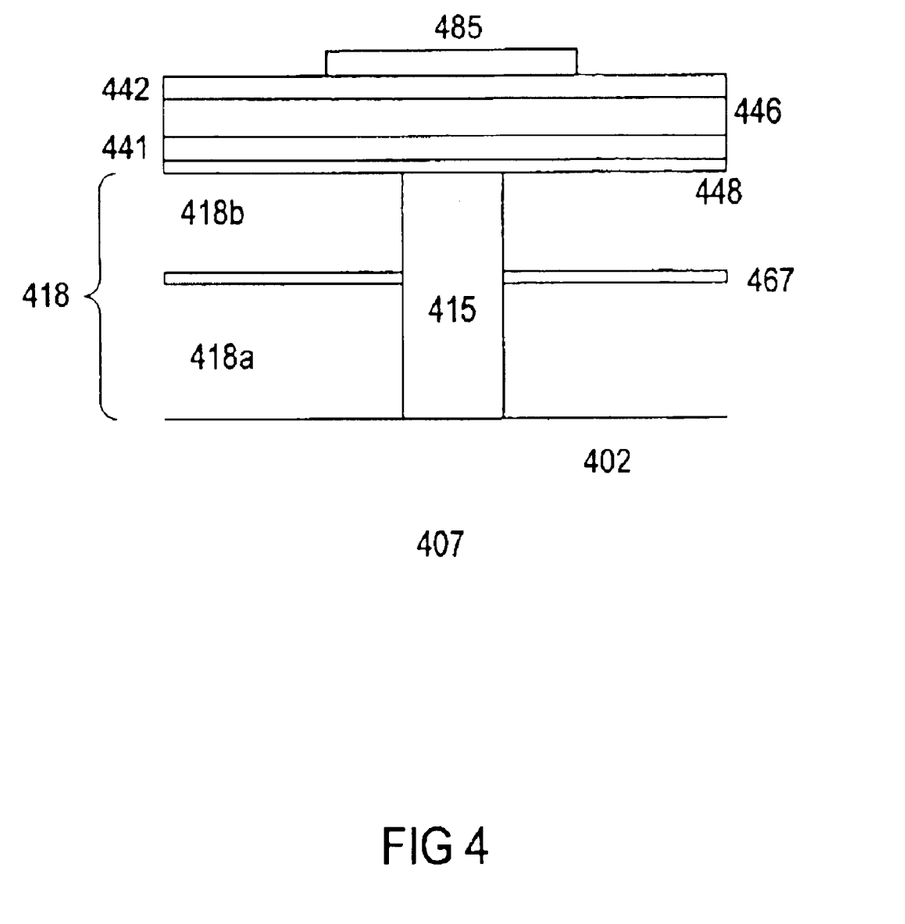
FIGS. 4–8 show a process for forming a capacitor in accordance with one embodiment of the invention.

A plug 415 is formed in the dielectric layer. The plug is coupled to, for example, one of the diffusion regions of the transistor. In one embodiment, the plug serves as the plug which couples the capacitor to the transistor (AAC plug). The plug can be formed using conventional techniques. Such techniques include, for example, etching a via (or contact opening) in the dielectric layer and filling it with conductive material. The conductive material comprises, for example, tungsten (W). Other types of conductive materials, such as doped poly-silicon, are also useful. The tungsten is deposited, in one embodiment, by sputtering or CVD. Other deposition techniques are also useful. Excess conductive material can be removed from the surface of the dielectric layer using a chemical mechanical polishing (CMP) process or can be etched back. For poly-silicon type plugs, a metal silicide layer can be provided on the plug surface.

A lower barrier layer 467 can be provided between the top of the plug and transistor. The lower barrier layer prevents the penetration of; for example, hydrogen to the capacitor from beneath. Various types of materials can be used. For example, the lower barrier layer can be formed from silicon nitride or aluminum oxide. Other types of barrier materials can also be used to form the barrier layer.

In one embodiment, the SAA plug coupled to the other diffusion region of the transistor is formed in two separate processes. Forming the plug in two separate processes reduces the aspect ratio of the contact opening, thus facilitating the fill process. The lower portion can be formed by, for example, depositing a first dielectric layer 418a over the transistor, etching a contact opening, and filling it with a conductive material. Subsequently, a second dielectric layer 418b is deposited thereover. Alternatively, the lower portion of the SAA plug is formed prior to forming the lower barrier layer. In yet another embodiment, the SAA plug can be formed in a single process after the capacitor is fabricated.

The process continues to form the capacitor. In one embodiment, the process continues to form a ferroelectric capacitor. Forming other types of capacitors is also useful. An adhesion layer (not shown) and a barrier layer 448 can be deposited on the dielectric layer. The barrier layer, in one embodiment, comprises iridium oxide. Other barrier materials which prevent diffusion of oxygen can also be used. The adhesion layer, for example, comprises titanium or other types of materials which promote adhesion between the dielectric layer and the barrier layer.

Above the barrier layer, a first electrode layer 441 is deposited. The electrode material comprises, for example, a metal such as platinum. Other types of conductive materials, such as iridium or iridium oxide, can also be used to form the electrode. Subsequently, a ferroelectric and second electrode layers 446 and 442 are deposited. The ferroelectric layer, in one embodiment, comprises PZT. Other ferroelectric materials are also useful. The various layers can be deposited using conventional techniques, such as sputtering or CVD or spin-on. Alternatively, other layers can be deposited for forming other types of capacitors, such as non-ferroelectric capacitors.

A mask layer is deposited over the capacitor layers and patterned to form an etch mask 485. The etch mask corresponds to the capacitor that is to be formed. In one embodiment, the mask layer comprises a hard mask material, such as TEOS. Other types of hard mask materials, including nitride, can also be used. The hard mask is patterned using for example, a patterned photoresist mask. The use of other types of masks, such as photoresist masks, are also useful.

Figure 5:
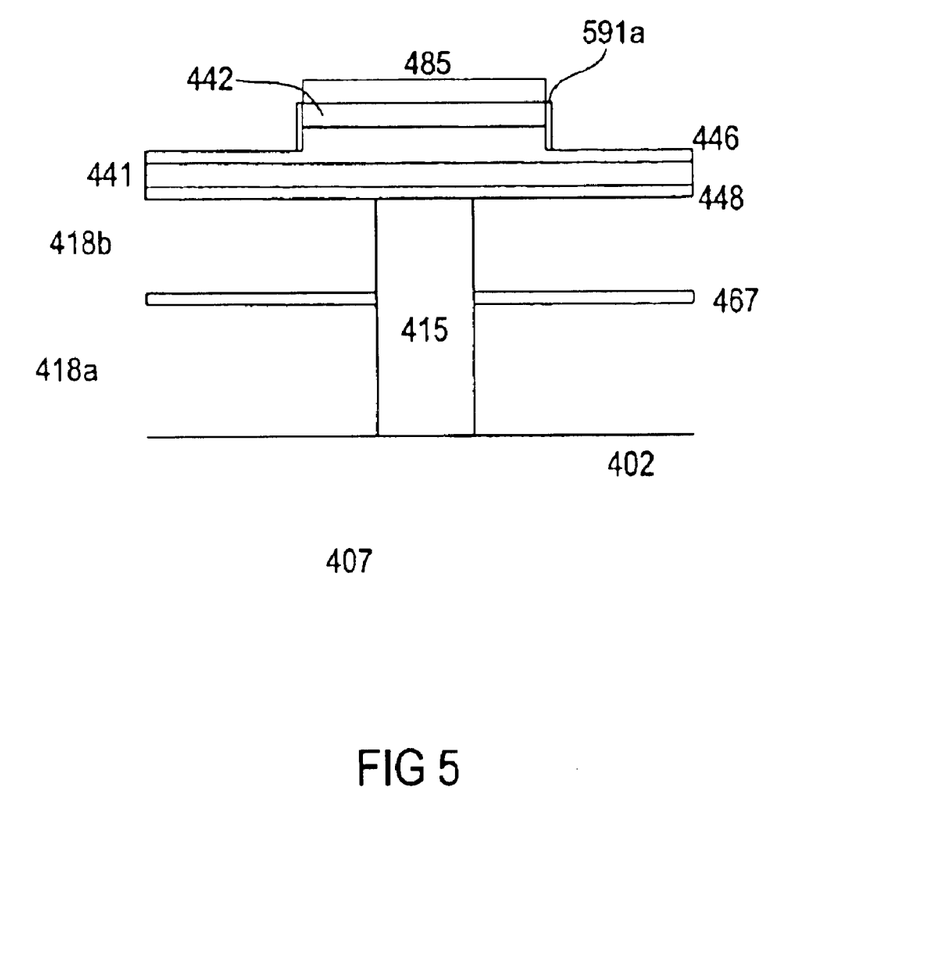

Referring to FIG. 5, the capacitor layers are anisotropically etched. The etch, for example, comprises a reactive ion etch (RIE). As the top electrode layer is etched, a conductive fence 591a may form on the sidewalls of the capacitor. In one embodiment, the etch patterns only the upper portion of the capacitor. The demarcation between the upper and lower portions of the capacitor is located between the top and bottom surfaces of the dielectric layer. In one embodiment, the demarcation between the upper and lower portions is selected to prevent shorting of the electrodes. Preferably, the demarcation between the upper and lower portion is at least 3 nm away from the bottom surface of the capacitor dielectric layer. More preferably, the demarcation between the upper and lower portions is at least 5–10 nm away from the bottom surface of the capacitor dielectric layer.

Figure 6:
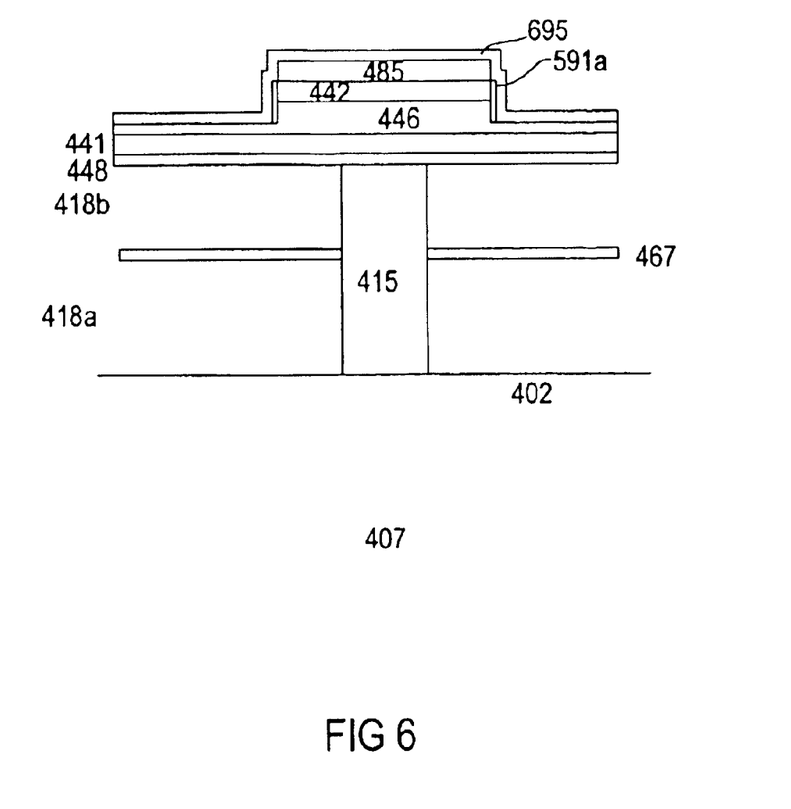

In FIG. 6, a dielectric layer 695 is deposited on the substrate, covering the partially patterned capacitor structure. In one embodiment, the dielectric layer comprises aluminum oxide. Other dielectric materials can also be used. The thickness of the dielectric layer should be sufficiently thick to prevent shorting of the electrodes. Typically, the thickness is about 1–10 nm. Preferably the thickness is about 5 nm.

Figure 7:
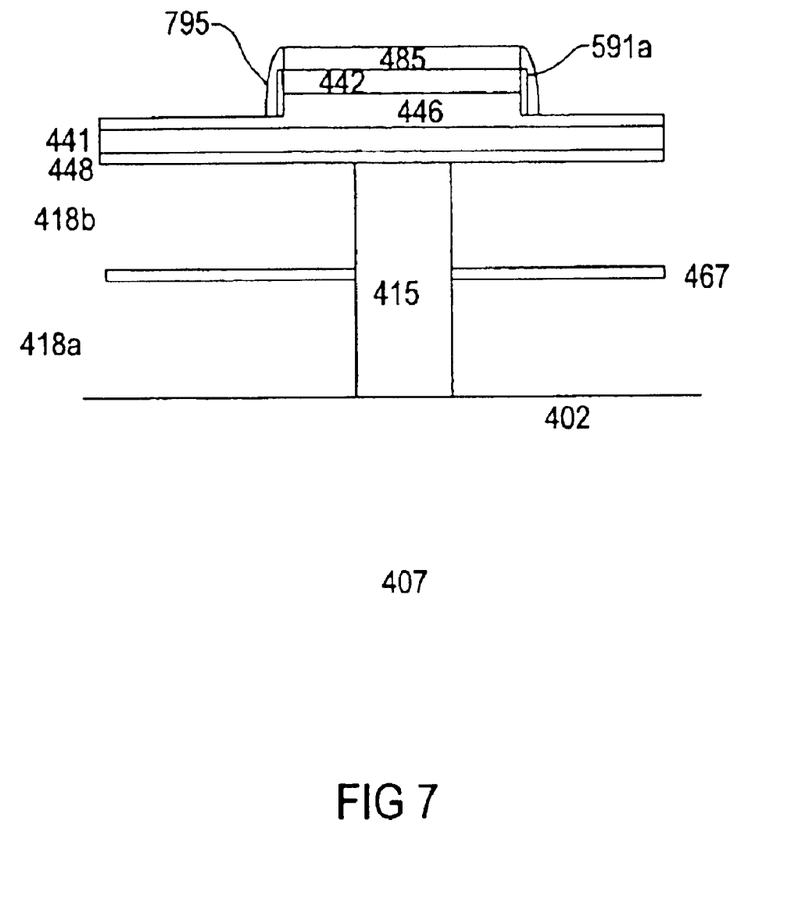

Referring to FIG. 7, the dielectric layer is then etched, removing the horizontal components to form spacers 795 on the sidewalls of the upper portion of the partially patterned capacitor structure. In one embodiment, the etch comprises an anisotropic etch, such as an RIE. The spacers cover the conductive fence on the capacitor sidewalls.

Figure 8:
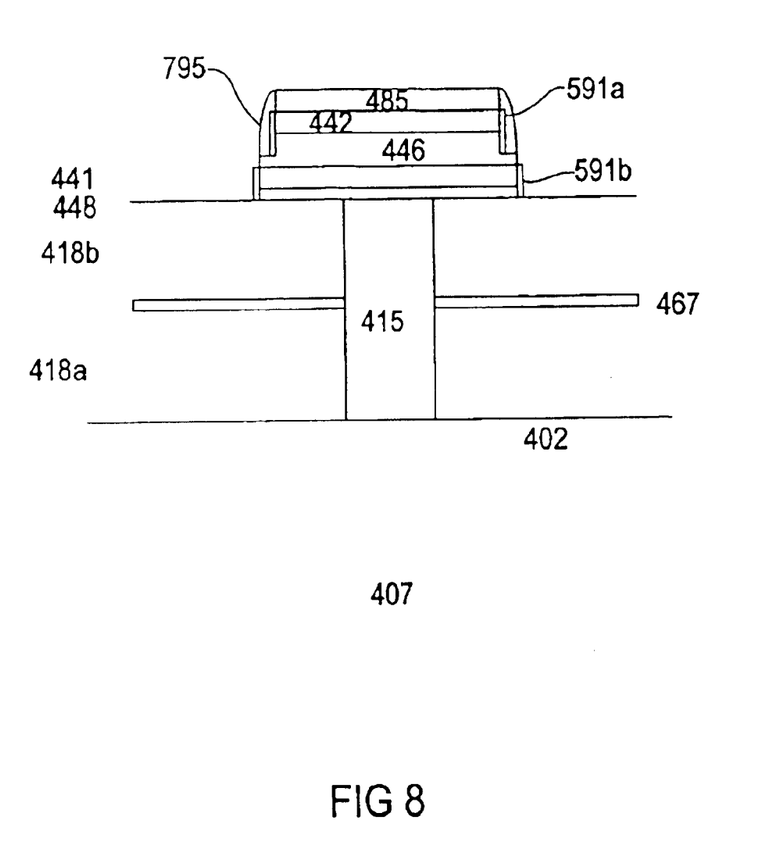

Referring to FIG. 8, an RIE is performed to continue patterning the capacitor layers, forming the lower portion of the capacitor. As the etch patterns the lower electrode, a conductive fence 591b may form on the sidewalls of the capacitor. However, the portions of the fence in the upper and lower portions of the capacitor are physically decoupled due to the spacers, thus preventing shorting of the top and bottom electrodes.

After the capacitor is patterned, the hard mask is removed. An encapsulation layer can be deposited to cover the capacitor, protecting it from hydrogen or oxygen. The encapsulation layer comprises, for example, aluminum oxide. Other materials which can serve as a barrier to hydrogen or oxygen are also useful. A dielectric is deposited to cover the capacitor. In one embodiment, the dielectric layer comprises $SiO_2$. Other dielectric materials are also useful. The dielectric layer is deposited using conventional techniques.

The process continues, for example, to form the interconnections to the capacitor. For example, the top electrode is coupled to a plateline, the second diffusion region of the transistor is coupled to a bitline, and the gate of the transistor is coupled to a wordline. Alternatively, the top electrode can be coupled to a reference voltage, such as in the case of non-ferroelectric memory cells.

In another embodiment, the capacitor layers are patterned to form first and second capacitors of a capacitor pair, such as those employed in, for example, series architecture. In one embodiment, the capacitors share a common bottom electrode. This can be achieved by first patterning the bottom electrode followed by deposition of the other capacitor layers. The process then continues as described from FIG. 5 onwards. Alternatively, the upper portions of the capacitors are first formed as described in FIGS. 5–7. Thereafter the lower portions of the capacitors are patterned in two processes. The first process patterns the lower portion to the bottom electrode layer. An overetch may be performed to ensure separation of the dielectric layers of the first and second capacitors. The second process patterns the bottom electrode layer, forming a common bottom electrode for the capacitors of the pair.

The process then continues, for example, forming encapsulation layer, dielectric layer, contacts and interconnects to the memory cell. For series architecture, the top electrode of a capacitor is coupled to the second diffusion of its respective cell transistor. A bitline is coupled to one end of the group and a plateline or reference voltage is coupled to the other end of the group. Wordlines are coupled to the gates of the cell transistors of the group.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A capacitor structure comprising:
   a capacitor including
      a top electrode,
      a bottom electrode,
      a capacitor dielectric layer between the top and bottom electrodes,
      wherein the capacitor includes an upper and a lower portion, the demarcation of the upper and lower portion is between top and bottom surfaces of the capacitor dielectric layer; and
   a dielectric sidewall spacer covering capacitor sidewalls in the upper portion of the capacitor, the dielectric sidewall spacer serves as a self-aligned etch mask for forming the lower portion of the capacitor, wherein the sidewall spacer creates a discontinuity in conductive fence that can form during patterning of the capacitor to prevent shorting of the electrodes.

2. The capacitor structure of claim 1 further comprises a bottom electrode plug electrically coupled to the bottom electrode and to a first diffusion region of a transistor, the capacitor and transistor forming a memory cell of a memory array.

3. The capacitor structure of claim 1 further comprises a bottom electrode plug electrically coupled to a common bottom electrode of a capacitor pair and to a common first diffusion region of first and second transistors, the capacitor pair and transistors form a memory cell pair of a portion of a group of cells arranged in a series architecture, a plurality of groups are interconnected to form a memory array.

4. The capacitor structure of claim 1 wherein the capacitor comprises a ferroelectric capacitor wherein the capacitor dielectric layer comprises a ferroelectric material.

5. The capacitor structure of claim 4 further comprises a bottom electrode plug electrically coupled to the bottom electrode and to a first diffusion region of a transistor, the capacitor and transistor forming a memory cell of a memory array.

6. The capacitor structure of claim 4 further comprises a bottom electrode plug electrically coupled to a common bottom electrode of a capacitor pair and to a common first diffusion region of first and second transistors, the capacitor pair and transistors form a memory cell pair of a portion of a group of cells arranged in a series architecture, a plurality of groups are interconnected to form a memory array.

7. The capacitor structure of any one of claims 1–6 wherein the demarcation between the upper and lower portions of the capacitors prevent shorting of the electrodes.

8. A capacitor structure comprising:
a capacitor including
a top electrode,
a bottom electrode,
a capacitor dielectric layer between the top and bottom electrodes,
wherein the capacitor includes an upper and a lower portion, the upper and lower portion whose demarcation is between top and bottom surfaces of the capacitor dielectric layer, the demarcation between the upper and lower portions of the capacitors prevent shorting of the electrodes by conductive fence which can form during processing, wherein the demarcation between the upper and lower portions is located at least 3 nm from the bottom surface of the capacitor dielectric layer; and
a dielectric sidewall spacer covering capacitor sidewalls in the upper portion of the capacitor.

9. The capacitor structure of claim 8 wherein the demarcation between the upper and lower portions is located about 5–10 nm from the bottom surface of the capacitor dielectric layer.

10. The capacitor structure of claim 7 wherein the dielectric sidewall spacer comprises a dielectric material selected from the group comprising oxides, nitrides, aluminum oxide or combination thereof.

11. A capacitor structure comprising:
a capacitor including
a top electrode,
a bottom electrode,
a capacitor dielectric layer between the top and bottom electrodes,
wherein the capacitor includes an upper and a lower portion, the upper and lower portion whose demarcation is between top and bottom surfaces of the capacitor dielectric layer, the demarcation between the upper and lower portions of the capacitors prevent shorting of the electrodes by conductive fence which can form during processing, wherein the demarcation between the upper and lower portions is located at least 3 nm from the top and bottom surfaces of the capacitor dielectric layer; and
a dielectric sidewall spacer covering capacitor sidewalls in the upper portion of the capacitor, the dielectric sidewall spacer comprises a dielectric material selected from the group comprising oxides, nitrides, aluminum oxide or combination thereof.

12. The capacitor structure of claim 11 wherein the demarcation between the upper and lower portions is located about 5–10 nm from the bottom surface of the capacitor dielectric layer.

13. The capacitor structure of claim 10 wherein the dielectric layer comprises a thickness sufficient to prevent shorting of the capacitor electrodes.

14. A capacitor structure comprising:
a capacitor including
a top electrode,
a bottom electrode,
a capacitor dielectric layer between the top and bottom electrodes,
wherein the capacitor includes an upper and a lower portion, the upper and lower portion whose demarcation is between top and bottom surfaces of the capacitor dielectric layer, the demarcation between the upper and lower portions of the capacitors prevent shorting of the electrodes by conductive fence which can form during processing, wherein the demarcation between the upper and lower portions is located at least 3 nm from the top and bottom surfaces of the capacitor dielectric layer; and
a dielectric sidewall spacer covering capacitor sidewalls in the upper portion of the capacitor, wherein the dielectric layer comprises a thickness sufficient to prevent shorting of the capacitor electrodes, the dielectric sidewall spacer comprises a dielectric material selected from the group comprising oxides, nitrides, aluminum oxide or combination thereof.

15. The capacitor structure of claim 14 wherein the demarcation between the upper and lower portions is located about 5–10 nm from the bottom surface of the capacitor dielectric layer.

16. The capacitor structure of claim 7 wherein the dielectric layer comprises a thickness sufficient to prevent shorting of the capacitor electrodes.

17. A capacitor structure comprising:
a capacitor including
a top electrode,
a bottom electrode,
a capacitor dielectric layer between the top and bottom electrodes,
wherein the capacitor includes an upper and a lower portion, the upper and lower portion whose demarcation is between top and bottom surfaces of the capacitor dielectric layer, the demarcation between the upper and lower portions of the capacitors prevent shorting of the electrodes by conductive fence which can form during processing, wherein the demarcation between the upper and lower portions is located at least 3 nm from the bottom surface of the capacitor dielectric layer; and
a dielectric sidewall spacer covering capacitor sidewalls in the upper portion of the capacitor, the dielectric layer comprises a thickness sufficient to prevent shorting of the capacitor electrodes.

18. The capacitor structure of claim 17 wherein the demarcation between the upper and lower portions is located about 5–10 nm from the bottom surface of the capacitor dielectric layer.

19. The capacitor structure of claim 7 wherein the demarcation between the upper and lower portions is at least 3 nm from the bottom surface of the capacitor dielectric layer.

20. The capacitor structure of claim 10 wherein the demarcation between the upper and lower portions is at least 3 nm from the bottom surface of the capacitor dielectric layer.

21. The capacitor structure of claim 13 wherein the demarcation between the upper and lower portions is at least 3 nm from the bottom surface of the capacitor dielectric layer.

22. The capacitor structure of claim 16 wherein the demarcation between the upper and lower portions is at least 3 nm from the bottom surface of the capacitor dielectric layer.

* * * * *